(12) United States Patent
Burch et al.

(10) Patent No.: US 11,640,160 B2
(45) Date of Patent: May 2, 2023

(54) PATTERN-ENHANCED SPATIAL CORRELATION OF TEST STRUCTURES TO DIE LEVEL RESPONSES

(71) Applicant: PDF Solutions, Inc., Santa Clara, CA (US)

(72) Inventors: Richard Burch, McKinney, TX (US); Qing Zhu, Rowlett, TX (US)

(73) Assignee: PDF Solutions, Inc., Santa Clara, CA (US)

( * ) Notice: Subject to any disclaimer, the term of this patent is extended or adjusted under 35 U.S.C. 154(b) by 0 days.

(21) Appl. No.: 17/395,632

(22) Filed: Aug. 6, 2021

(65) Prior Publication Data
US 2022/0043436 A1 Feb. 10, 2022

Related U.S. Application Data

(60) Provisional application No. 63/062,982, filed on Aug. 7, 2020.

(51) Int. Cl.
G05B 19/418 (2006.01)

(52) U.S. Cl.
CPC .......... G05B 19/41875 (2013.01); G05B 2219/45031 (2013.01)

(58) Field of Classification Search
None
See application file for complete search history.

(56) References Cited

U.S. PATENT DOCUMENTS

| | | | |
|---|---|---|---|
| 8,477,109 B1* | 7/2013 | Freed | G06F 3/04842 345/173 |
| 10,026,589 B1* | 7/2018 | Monahan | H01J 37/265 |
| 10,579,042 B2* | 3/2020 | Wang | G05B 19/406 |
| 10,713,769 B2* | 7/2020 | Zhang | G06N 3/0472 |
| 11,037,286 B2* | 6/2021 | Asbag | G06K 9/6281 |
| 11,176,658 B2* | 11/2021 | Baidya | G06V 10/762 |
| 2007/0288185 A1 | 12/2007 | Burch | |
| 2007/0288219 A1* | 12/2007 | Zafar | G03F 1/84 703/14 |
| 2008/0301597 A1 | 12/2008 | Chen | |
| 2010/0057391 A1 | 3/2010 | St. Pierre | |
| 2016/0189055 A1* | 6/2016 | Zvitia | G05B 19/41875 706/11 |
| 2017/0109646 A1 | 4/2017 | David et al. | |
| 2020/0013161 A1 | 1/2020 | Baidya | |
| 2020/0380655 A1* | 12/2020 | Chu | G03F 7/7065 |

OTHER PUBLICATIONS

Taha, et al. "Clustering the dominant defective patterns in semiconductor wafer maps." IEEE Transactions on Semiconductor Manufacturing 31.1 (Oct. 30, 2017): 156-165. Entire Document.
Wang. "Separation of composite defect patterns on wafer bin map using support vector clustering." Expert Systems with Applications 36.2 (Mar. 1, 2009): 2554-2561. Entire Document.
International Search Report dated Nov. 17, 2021.
Outgoing Written Opinion of the ISA dated Nov. 17, 2021.

* cited by examiner

*Primary Examiner* — Jason Lin
(74) *Attorney, Agent, or Firm* — Dergosits & Noah LLP

(57) ABSTRACT

Enhancement of less dominant patterns for parametric wafer measurements. Dominant patterns are removed from the parametric pattern thereby revealing a less dominant pattern. The less dominant patterns can be used to identify root causes for yield loss that are not visible in the original parametric measurements.

10 Claims, 3 Drawing Sheets

PATTERN-ENHANCED SPATIAL CORRELATION OF TEST STRUCTURES TO DIE LEVEL RESPONSES

TECHNICAL FIELD

This disclosure relates to a technique for correlating parametric measurements to yield data.

BACKGROUND

Correlating scribe-line test structure measurements to die-level or wafer-level yield has long been a staple technique of semiconductor root cause analysis. The goal of most test structures is to measure directly a physical quantity that could be correlated to yield. However, in practice this is difficult to accomplish.

Consider the cross-section of a portion of a typical contact chain test structure 100 illustrated in FIG. 1. Formed in the scribe line region of a wafer for parametric testing, the wafer may include thousands of these contacts in a single test structure, wherein a metal line 110 connects via contact 112 to an active area 114 of a semiconductor wafer, which in turn is connected via contact 116 to another metal line 118, that is then connected via contact 120 to the next active area 122, and so on, for the remainder of the chain-type structure. The goal of the contact chain structure 100 is to measure the contact resistance, which is a function of the many physical characteristics of the contact: depth, height, profile, barrier layer thickness, etc. However, the contact resistance is also a function of the metal thickness and width, the active region thickness and width, the doping of the active region, and many other physical characteristics that could be affecting yield.

One approach is to isolate various of these physical measurements by designing multiple test structures that are more sensitive to the specific physical quantities of interest. Measurements of all test structures can then be used to estimate the specific physical quantities. This "design of experiments" approach can be very effective, although it typically requires a large number of test structures yet only produces an estimation of quantities that the designer can actually anticipate.

In many cases, however, the number of measured test structures is limited and the spatial variation and wafer-to-wafer variation in the test structure measurements tend to be dominated by just one or two factors. Thus, in the present approach, the most consistent, dominant factors are removed to identify correlations of die-level yield patterns with less dominant factors.

DETAILED DESCRIPTION

The present disclosure describes methods and systems for correlating die-level yield patterns with less dominant factors by decomposing a wafer parametric pattern to remove the dominant factors thereby enhancing the less dominant factors. This technique of pattern enhancement is useful in fault detection and classification systems where excursions in the parametric pattern do not correlate well with the wafer bin pattern. Further, the results of pattern enhancement can narrow the realm of possible root cause(s) for the excursions.

Figure 1:
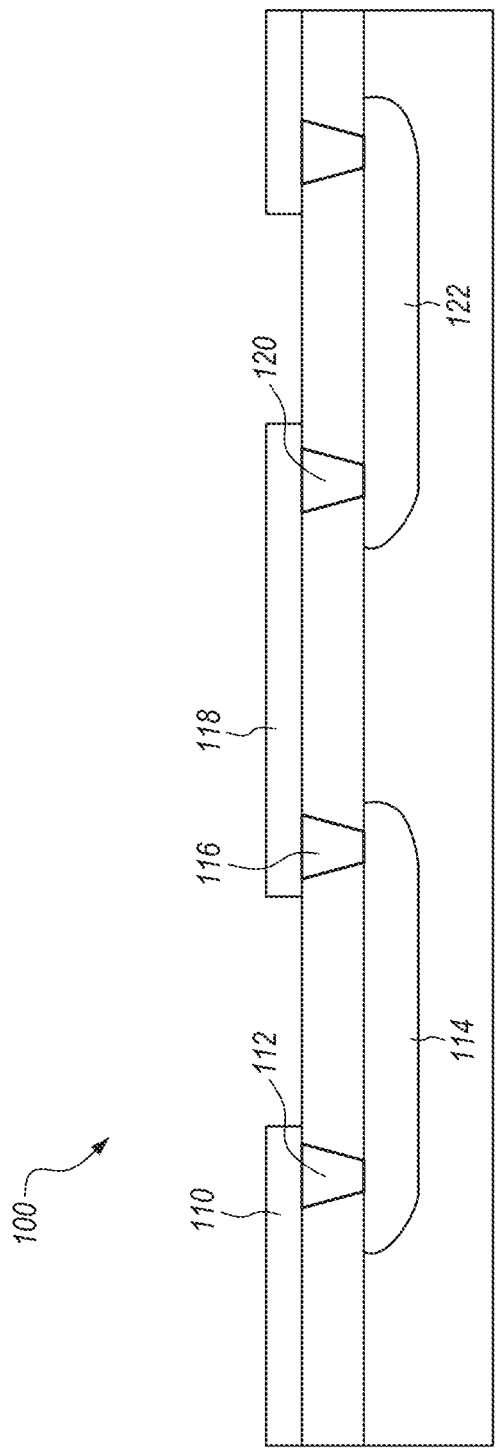
FIG. 1 is a cross-sectional diagram of a typical contact chain test structure for inclusion on a semiconductor wafer.

The results of parametric measurements from test structures formed in scribe line regions of a semiconductor wafer, such as the test structure 100 shown in FIG. 1, can typically be broken down into a few categories, such as wafer-to-wafer variations, common spatial patterns, and other spatial patterns caused by specific known physical factors. By removing these known patterns that typically dominate parametric measurements from the original parametric pattern, the strongest underlying spatial pattern for the parametric measurement is revealed. In many cases, the underlying spatial pattern will correlate to the bin pattern even though the original parametric value does not, thus providing a useful tool for root cause analysis. The process of revealing this secondary spatial pattern is called pattern enhancement in this disclosure.

Figure 2:
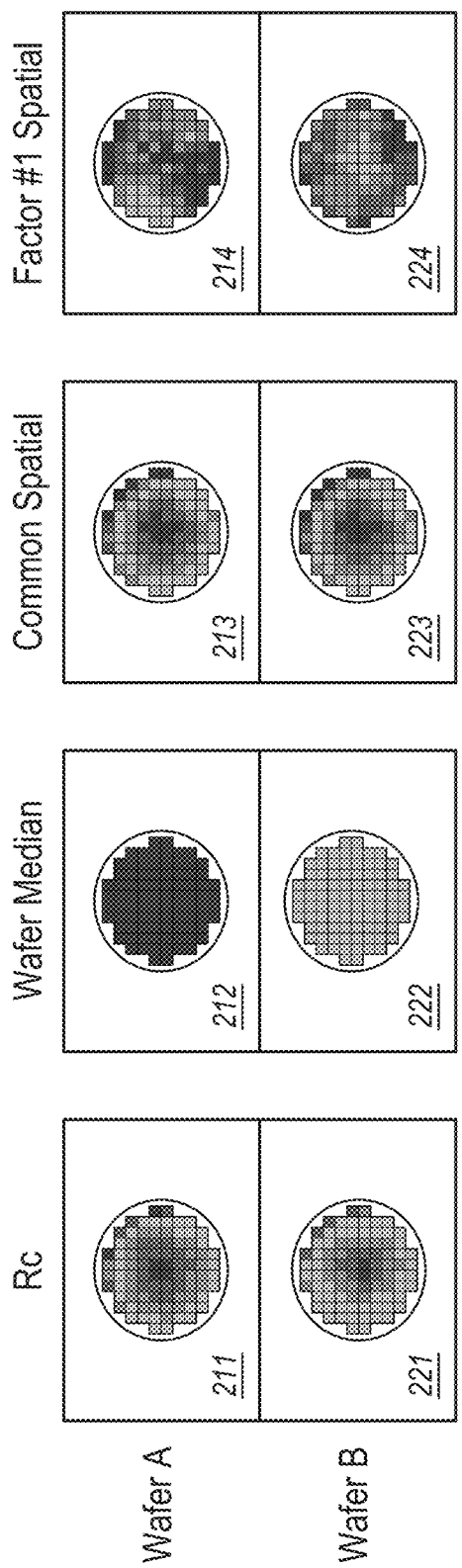
FIG. 2 is a collection of wafer maps showing parametric patterns for two wafers and the results of parametric pattern enhancement.

FIG. 2 illustrates an example of pattern enhancement applied to two wafers A and B having similar parametric patterns, represented as wafer maps 211 and 221. In this case, the similar patterns are of measured contact resistance, although other parametric measurements could be used. Using a greyscale that ranges from light grey as the highest parametric value to dark grey as the lowest parametric value, it is obvious from visual observation of the wafer maps 211 and 221 that they are similar because the darker grey areas at the top right and center regions of each wafer exhibits similar patterns of lower measured contact resistance values as compared with the rest of the wafer.

The parametric wafer maps 211 and 221 are thus decomposed into several constituent dominant patterns and those patterns removed. For example, as noted above, wafer-to-wafer variations are known to regularly occur during fabrication, and that difference is removed by processing the data to have all wafer maps centered on the same point, e.g., by computing the median (or the mean) for the wafer maps 211 and 221, with the results shown as the single-value wafer maps 212 and 222, respectively. It is evident from the greyscale result that wafer map 212 indicates a lower median contact resistance value for wafer A than wafer map 222 indicates for wafer B. The wafer medians 212 and 222 are subtracted from the respective parametric wafer maps 211 and 212, respectively.

A common spatial variation is also determined for the respective parametric wafer maps. Each and every corresponding parametric measurement for similar wafers will likely exhibit some degree of similarity, and if you stacked up numerous similar wafers, a relatively consistent, common spatial pattern would be evident. The common spatial pattern is extracted from the corresponding parametric wafer map 211 and 221, with the results shown as wafer maps 213 and 223, respectively. There may be other dominant spatial patterns that can also be identified and removed from the parametric pattern.

In this example, the wafer medians 212, 222 and the common spatial patterns 213, 223 are subtracted from the corresponding parametric patterns on wafer maps 211 and 221, respectively, and the resulting patterns are enhanced patterns, with dominant factors removed, and less dominant factors revealed, as shown on wafer maps 214 and 224, respectively. If other dominant spatial patterns are identified, they are subtracted from the parametric pattern as well.

It is evident from visual inspection that the enhanced pattern wafer map 214 has low values indicated by darker areas on the bottom left and top right, while the enhanced pattern wafer map 224 has low values indicated by darker areas on the bottom right and a little bit on the top left. This particular type of problem is common for a tool with a rotational pattern, and upon seeing the resultant wafer maps 214 and 224, the responsible engineer is better informed about what to look for as root cause(s).

Thus, for this example, the pattern enhancement tool works well to model yield, and in many cases, the pattern enhancement tool provides a better model for yield than one based simply on the parametric results.

Figure 3:
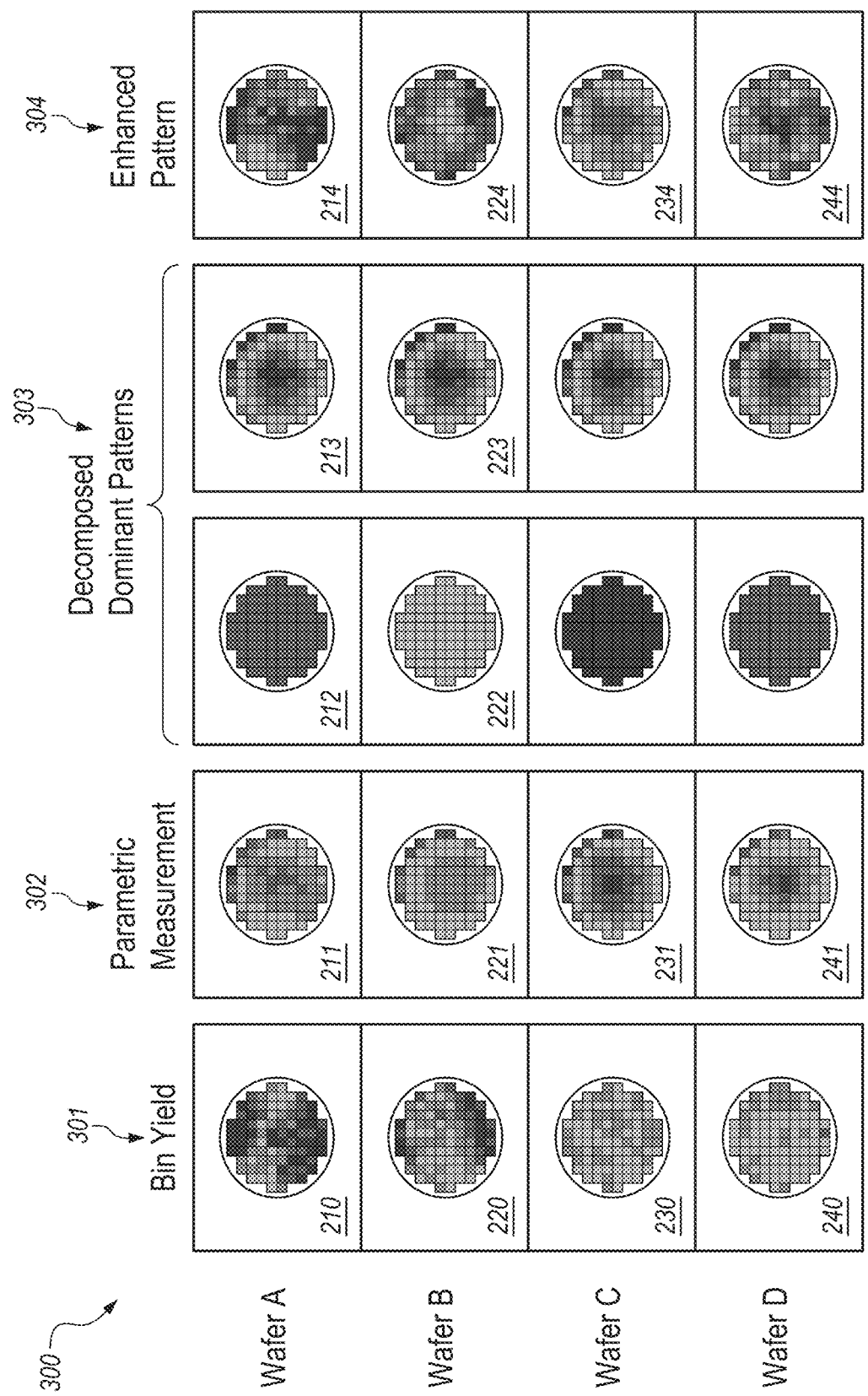
FIG. 3 is a table including the wafer maps of FIG. 2 as well as parametric patterns and the results of parametric pattern enhancement for two additional wafers.

FIG. 3 provides some additional detail for pattern enhancement analysis in a table 300 of wafers having similar parametric results. Wafers A and B are included in the first two rows per the discussion above, and wafers C and D are newly included in rows three and four respectively. The four wafers A, B, C and D are determined to have similar parametric profiles, as is visually evident from the wafer maps 211, 221, 231, 241 of parametric values in column 302, from the similar pattern of low contact resistance values in the top right of each wafer map and the similar pattern having varying degrees of lower contact resistance in the center of each wafer map.

Column 301 adds actual bin yield information for each of the wafers A, B, C and D. The comparison of parametric measurement wafer maps in column 302 with respective bin yield wafer maps in column 301 reveals that the parametric measurements are not a good indicator of bin yield for these wafers—thus the need for the pattern enhancement tool.

Column 303 illustrates the wafer medians; column 304 illustrates the common spatial pattern; and finally, column 305 illustrates the enhanced spatial pattern that results from removing the wafer median and the common spatial pattern from the parametric pattern in column 302.

It should be noted that each of the constituent columns 303 and 304 is scaled separately; that is, the same color scale is applied across all wafers for the relevant parametric values or operation results in that column. In contrast, the final enhanced pattern is scaled per wafer rather than across the entire column. In this way, the final enhanced pattern can be properly compared to the bin yield for that wafer.

For example, it is apparent from a visual comparison that enhanced pattern wafer maps 214 and 224 correspond well with the original bin yield wafer maps 210 and 220, respectively. Thus, the pattern enhancement tool has proved useful in identifying a pattern that may lead to solving a yield problem for wafers A and B. An engineer armed with knowledge about pattern differences in parametric measurements, such as contact resistance, or threshold voltage, or drive current, etc., is able to more narrowly focus an investigation into the problem causing reduced yield and the root cause(s) therefore. For example, given an unexpected excursion by a specific parametric measurement, there is a limited set of issues that relate to problems with that specific parametric measurement.

In contrast, although wafers C and D go through the same pattern enhancement process, there is no apparent correlation between the final enhanced patterns on wafer maps 234 and 244 and the corresponding original bin yield wafer maps 230 and 240, respectively. Of course, this makes sense since there was no bin yield pattern to begin with on wafer maps 230 and 240 because wafers C and D are, in general, good wafers showing a consistent yield across the wafer. However, the pattern enhancement tool has revealed that some other issue is causing variations in contact resistance for wafers C and D—but the issue is not impacting yield.

Once the enhanced pattern is revealed, any type of standard correlation technique can be used to identify wafers where the bin yield pattern is correlated to the enhanced parametric pattern.

Processing of images and large datasets for pattern enhancement is facilitated by the emergence of parallel processing architectures and the advancement of Machine Learning algorithms which allow users to gain insights and make predictions using massive amounts of data at speeds that make such approaches relevant and realistic. Machine Learning is a branch of artificial intelligence that involves the construction and study of modeled systems that can learn from data. These types of ML algorithms, along with parallel processing capabilities, are much better suited for engaging in multivariate analysis. Further, an effective machine learning approach to fault detection and classification should include active learning modes and use the information gained to continuously improve the accuracy of the model and its predictions.

As noted above, technical personnel are typically knowledgeable regarding a narrow field of possible root causes when presented with an enhanced parametric pattern that correlates directly to bin yield. For example, if pattern enhancement reveals a problem with drive current and off current, the engineer knows the problem is not related to a metallization issue or gate critical dimensions, but is most likely something wrong in the active region. The engineer's knowledge base could also be algorithmically programmed into an ML model for determining root cause, and the enhanced parametric data provided as input to the ML model. Feature engineering and selection can be performed on the input to narrow the parametric data to a set of key features determined to be most important and relevant for identifying and removing dominant patterns from the parametric data.

The creation and use of processor-based models for root cause determination can be desktop-based, i.e., standalone, or part of a networked system; but given the heavy loads of information to be processed and displayed with some interactivity, processor capabilities (CPU, RAM, etc.) should be current state-of-the-art to maximize effectiveness. In the semiconductor foundry environment, the Exensio® analytics platform is a useful choice for building interactive GUI templates. In one embodiment, coding of processing routines may be done using Spotfire® analytics software version 7.11 or above, which is compatible with Python object-oriented programming language, used primarily for coding machine language models.

The foregoing description has been presented for the purpose of illustration only—it is not intended to be exhaustive or to limit the disclosure to the precise form described. Many modifications and variations are possible in light of the above teachings.

The invention claimed is:

1. A processor-based modeling method, comprising:
   generating a first wafer map having a plurality of values corresponding to a multiplicity of parametric measurements obtained from a semiconductor wafer in a semiconductor manufacturing operation;
   identifying a dominant pattern of the plurality of values on the first wafer map;
   identifying the dominant pattern as a known spatial variation caused by a specific physical feature of the semiconductor wafer;

removing the dominant pattern from the first wafer map thereby generating a second wafer map and revealing a less dominant pattern of the plurality of values on the second wafer map;

training a machine learning model to determine the root cause on the basis of the less dominant pattern; and deploying the machine learning model in a semiconductor equipment operating environment.

2. The method of claim 1, further comprising:

identifying a plurality of dominant patterns in the plurality of values on the first wafer map; and removing the plurality of dominant patterns from the first wafer map thereby generating the second wafer map.

3. The method of claim 1, further comprising:

computing a statistical median or a statistical mean of the plurality of values on the first wafer map;

identifying a common spatial pattern of the plurality of values;

subtracting the statistical median or the statistical mean of the plurality of values and subtracting the common spatial pattern of the plurality of values from the plurality of values to thereby reveal the less dominant pattern.

4. The method of claim 3, further comprising:

subtracting the statistical median or the statistical mean of the plurality of values, the common spatial pattern of the plurality of values, and the spatial variation caused by a specific physical feature from the plurality of values to thereby reveal the less dominant pattern.

5. The method of claim 1, further comprising:

determining a correlation between the less dominant pattern and a bin yield pattern for the first semiconductor wafer.

6. A method, comprising:

obtaining a multiplicity of parametric measurements from a test structure formed on a semiconductor wafer in a semiconductor manufacturing operation;

plotting a plurality of values corresponding to the multiplicity of parametric measurements to generate a parametric wafer map image;

identifying at least one dominant pattern on the parametric wafer map image;

removing the at least one dominant pattern from the parametric wafer map image thus forming an enhanced wafer map image;

identifying, after the at least one dominant pattern is removed, a less dominant pattern of on the enhanced wafer map image;

training a machine learning model to determine the root cause on the basis of the less dominant pattern; and deploying the machine learning model in a semiconductor equipment operating environment.

7. The method of claim 6, further comprising:

identifying an additional dominant pattern in the multiplicity of parametric measurements on the parametric wafer map image; and removing the at least one dominant pattern and the additional dominant pattern from the parametric wafer map image to form the enhanced wafer map image.

8. The method of claim 7, further comprising:

computing a statistical median or a statistical mean of the parametric wafer map image;

identifying a common spatial pattern in the multiplicity of parametric measurements on the parametric wafer map image; and subtracting the statistical median or the statistical mean and the common spatial pattern from each of the plurality of values on the parametric wafer map image.

9. The method of claim 6, further comprising:

computing a statistical median or a statistical mean of the parametric wafer map image; and subtracting the statistical median or the statistical mean from each of the plurality of values on the parametric wafer map image.

10. The method of claim 6, further comprising:

identifying a spatial variation caused by a specific physical feature;

subtracting the statistical median or the statistical mean, the common spatial pattern and the spatial variation from each of the plurality of values on the parametric wafer map image.

\* \* \* \* \*